United States Patent [19]

Holcomb et al.

[11] Patent Number: 5,050,650

[45] Date of Patent: Sep. 24, 1991

[54] AXIAL LEAD ELECTRICAL COMPONENT FEEDER

[75] Inventors: Gregory W. Holcomb, 6336 Bryce Ave., Orange, Calif. 92667; Samuel R. Holcomb, Orange, Calif.

[73] Assignee: Gregory W. Holcomb, Orange, Calif.

[21] Appl. No.: 595,351

[22] Filed: Oct. 9, 1990

[51] Int. Cl.$^5$ .............................................. B21F 45/00
[52] U.S. Cl. ...................................... 140/105; 29/566.2
[58] Field of Search ........................... 29/566.2, 566.3; 140/105

[56] References Cited

U.S. PATENT DOCUMENTS

| | | | |
|---|---|---|---|
| 2,978,707 | 4/1961 | Runciman | 29/741 |
| 3,577,847 | 5/1971 | Scranton | 29/566.1 |
| 3,769,823 | 11/1973 | Greeninger | 72/335 |
| 3,993,108 | 11/1976 | Kirschenman et al. | 140/105 |
| 4,072,177 | 2/1978 | Daebler | 140/105 |
| 4,567,653 | 2/1986 | Heller et al. | 140/105 |
| 4,633,584 | 1/1987 | Wright et al. | 29/741 |
| 4,635,341 | 1/1987 | Staudinger | 29/566.3 |
| 4,644,633 | 2/1987 | Jones et al. | 29/566.3 |
| 4,711,015 | 12/1987 | Tega et al. | 29/566.2 |
| 4,780,950 | 11/1988 | Holcomb | 29/566.3 |
| 4,817,266 | 4/1989 | Holcomb | 29/566.3 |
| 4,819,699 | 4/1989 | Brown et al. | 140/105 |

FOREIGN PATENT DOCUMENTS 869088 10/1981 U.S.S.R. ............................. 29/566.3

Primary Examiner—Lowell A. Larson
Attorney, Agent, or Firm—Roberts and Quiogue

[57] ABSTRACT

An axial lead component feeder is described, which includes a lead cutting and forming station, at which the processed parts are presented at a part pickup location for robotic pickup. Taped axial lead components are fed to a lower process-start location. A cut/form pneumatic cylinder drives a lower die support block upward, directly passing cutting die carried by the support block through captured components leads to cut the leads to a desired length. In the same upward stroke of the cylinder, the leads are formed, and the processed part presented at the pickup location. The feeder has many advantages, including narrow footprint and low Z axis profile, reduced number of change tooling parts, increased part refresh rate and improved scrap tape removal.

24 Claims, 14 Drawing Sheets

AXIAL LEAD ELECTRICAL COMPONENT FEEDER

BACKGROUND OF THE INVENTION

The present invention relates to apparatus for cutting and forming the leads of taped electrical components, and more particularly to apparatus for cutting and forming the leads of taped components having axial leads.

Electronic components such as resistors, capacitors, and diodes are typically provided by component manufacturers with their leads secured to an elongated tape, in order to facilitate their use in the fabrication of electrical circuits. A particular type of component configuration, generally known as axial lead components, have leads which emerge from generally opposite sides of the component. Taped axial lead components are generally taped on both leads.

To utilize the taped parts in the fabrication of electrical circuits, taped axial lead electronic components are separated from the tape by cutting the leads and appropriately forming the cut leads for insertion.

U.S. Pat. No. 4,780,950 by the present inventor, Gregory W. Holcomb, describes one form of axial lead component feeder. While the feeder described in this patent works well and has many desirable features, it does have certain drawbacks which are addressed by the present invention. The feeder of the '950 patent cuts and forms the leads at one station, and then transports the part in process to a presentation station where it is available for pick up by a robot. The transport of the part lengthens the cycle time, and reduces the refresh rate of the feeder, i.e., the rate at which components may be processed by the feeder. Also, the feeder of the '950 patent has a superstructure which extends above the point at which the finished part is presented for robotic pickup. If the robot malfunctions, or is misprogrammed, the robot can crash into the superstructure extending above the level of the finished part.

U.S. Pat. No. 4,817,266 by the present inventor Gregory W. Holcomb describes a variable axial lead electrical component feeder. The apparatus described in the '266 patent accommodates a range of body and lead sizes and readily adjusts to accommodate various tape widths and pitches and is readily utilized with robotic assembly systems. As a result of its capability to adjust to these various conditions, the apparatus is relatively complex and expensive to fabricate. In the feeder described in this patent, strain relief clamping elements are projected above the level of the processed part during the cutting and forming operations.

For an axial lead feeder to form leads in a manner which meets military specifications on lead bends, the feeder must provide lead strain relief during the bending operation. Strain relief clamps add to the complexity to the feeder apparatus, and typically result in structure used for the clamping which extends or projects above the processed component. This increases the Z axis profile of the apparatus, and presents the possibility of damage if a component pick-up robot should inadvertently "crash" into such elevated structure.

It is therefore an object of the present invention to provide an axial lead component feeder of simplified construction, and which provides a relatively high component refresh rate, forms the leads with stain relief clamping, and does not require translation apparatus to move a processed part to a component pickup location.

SUMMARY OF THE INVENTION

These and other objects and advantages are achieved by a component lead cutting and forming apparatus for axial lead electronic components in accordance with the invention. The apparatus includes a lead cutting and forming station, wherein successive components secured to the tape are processed to cut and form the leads and presented at a station pickup location for robotic pickup.

Means are provided for driving the tape so as to present successive components secured to the tape to a process-start location comprising the station.

The cutting and forming station is further characterized in that the lead forming and cutting operations are performed as the component-in-process is moved from the process-start location to said pickup location within said station. The station includes:

(i) stationary upper forming die disposed above the process-start location, and having lead forming elements and lead cutting surfaces;

(ii) lower support means for supporting the component-in-process body and leads during the lead cutting and forming operations;

(iii) lower component lead cutting die members for acting in cooperation with the lead cutting surfaces of the upper forming die to cut the component-in-process leads to a desired length during the component lead cutting and forming operations; and (iv) means for translating the lower support means and lower cutting members to carry the component-in-process from the process-start position to the pickup position. The component-in-process leads are cut and formed during this translation. Thus, the component leads are cut and formed, and the component-in-process is moved from the process-start position to the pickup position, in a single movement.

The apparatus further comprises means for providing strain relief clamping of the leads of the component-in-process against the lower support means during the cutting and forming operation. Yet the apparatus has a relatively low Z axis profile, in that the apparatus does not have structure extending in the Z axis above the component pickup location in the vicinity of the station, thereby minimizing the risk that a pickup robot will inadvertently strike the apparatus structure in the course of component pickup movements.

The apparatus is further characterized by means for fully constraining the leads of a component-in-process at the process-start location of the station, thereby securing the component-in-process at the commencement of the cut and form process.

The apparatus further includes means for guiding the tape and lead scraps resulting from the cutting operation away from the cutting and forming operation. This guiding means comprises a tape scrap chute into which the tape and lead scraps are directed and which extends toward the rear of the apparatus away from the cutting and forming station, and air jet means for directing a stream of air along the scrap chute toward the rear of the apparatus, thereby tending to move the scrap toward the rear as the tape is driven toward the cutting and forming station.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
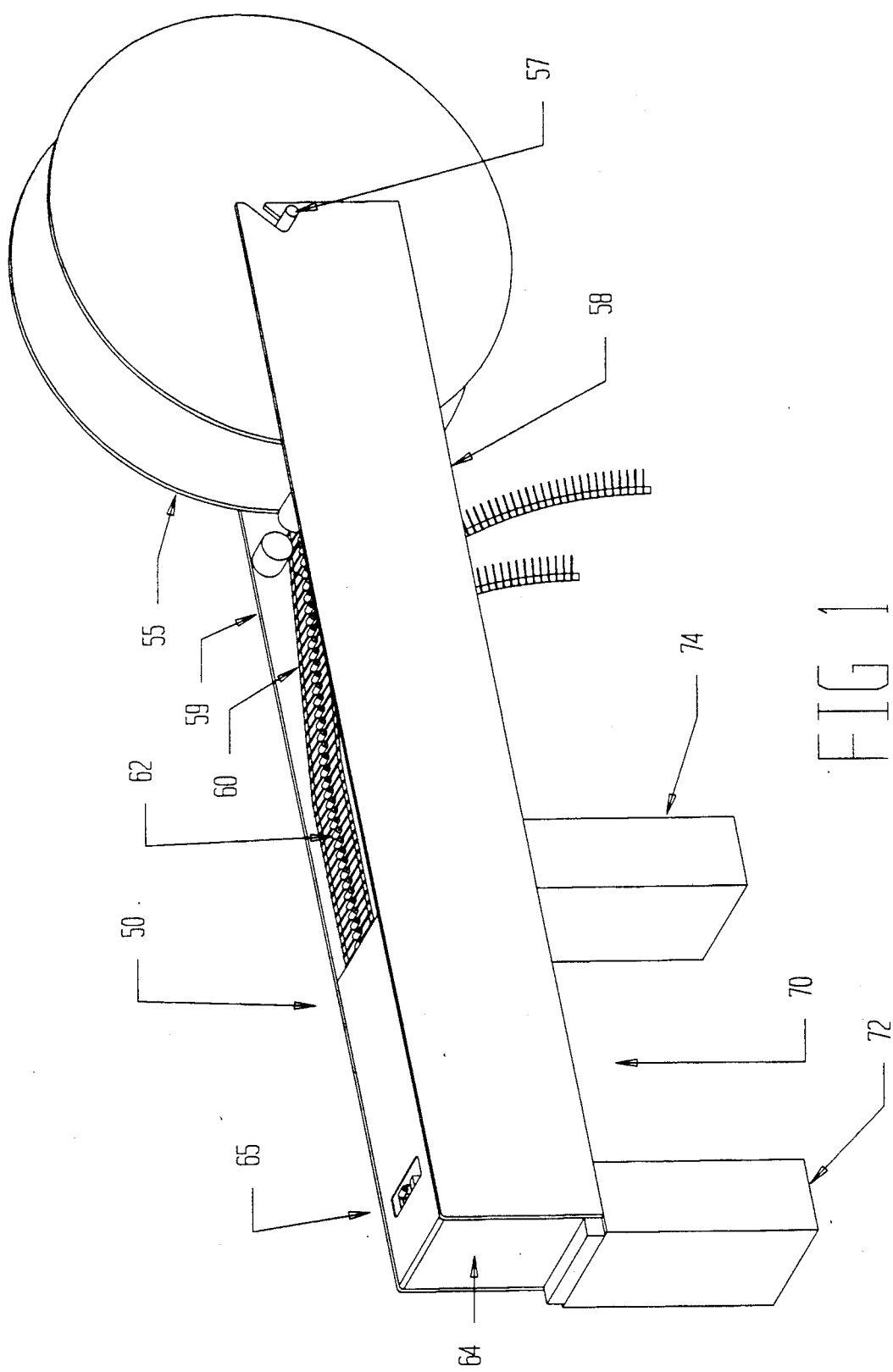
FIG. 1 is a perspective view of an axial lead electrical component feeder in accordance with the present invention.

An axial lead electrical component feeder 50 embodying the invention is shown in the perspective view of FIG. 1. In this exemplary embodiment, the components are fed from a tape reel 55 which rotates about axle 57, supported in angled slots formed in the respective side cover plates 58 and 59. The reel 55 carries a tape 60 to which are secured a succession of spaced axial lead components 62. Each component 62 is secured to the tape 60 by its leads, with the component body disposed between the parallel tape strips comprising the tape. Means other than a reel may be used to supply the feeder with taped components, such as ammunition box-style packaging of the taped components.

As will be described below, the apparatus 50 includes means for driving the tape to the component lead cutting and forming station 65 of the apparatus 50. At this station, the component leads are cut to a predetermined length from the tape 60, and formed to the desired shape. The respective tape strips are then led away as scrap. In accordance with the invention, the apparatus 50 is characterized by a narrow footprint and low vertical profile, both advantageous characteristics. The apparatus 50 is characterized by a relatively narrow body structure 70, which is supported on pedestal supports 72 and 74, in this exemplary embodiment.

An advantage of the feeder apparatus 50 is that the side cover plates 58 and 59 and the front end and top cover plate 64 can all be removed, and yet the apparatus 50 can still be operated. The tape reel support and scrap chutes are no longer present in this configuration, but this does not affect the functionality of the feeder for troubleshooting or servicing, since tape can still be fed into the unit. This advantage greatly facilitates servicing or troubleshooting for the feeder.

Figure 2:
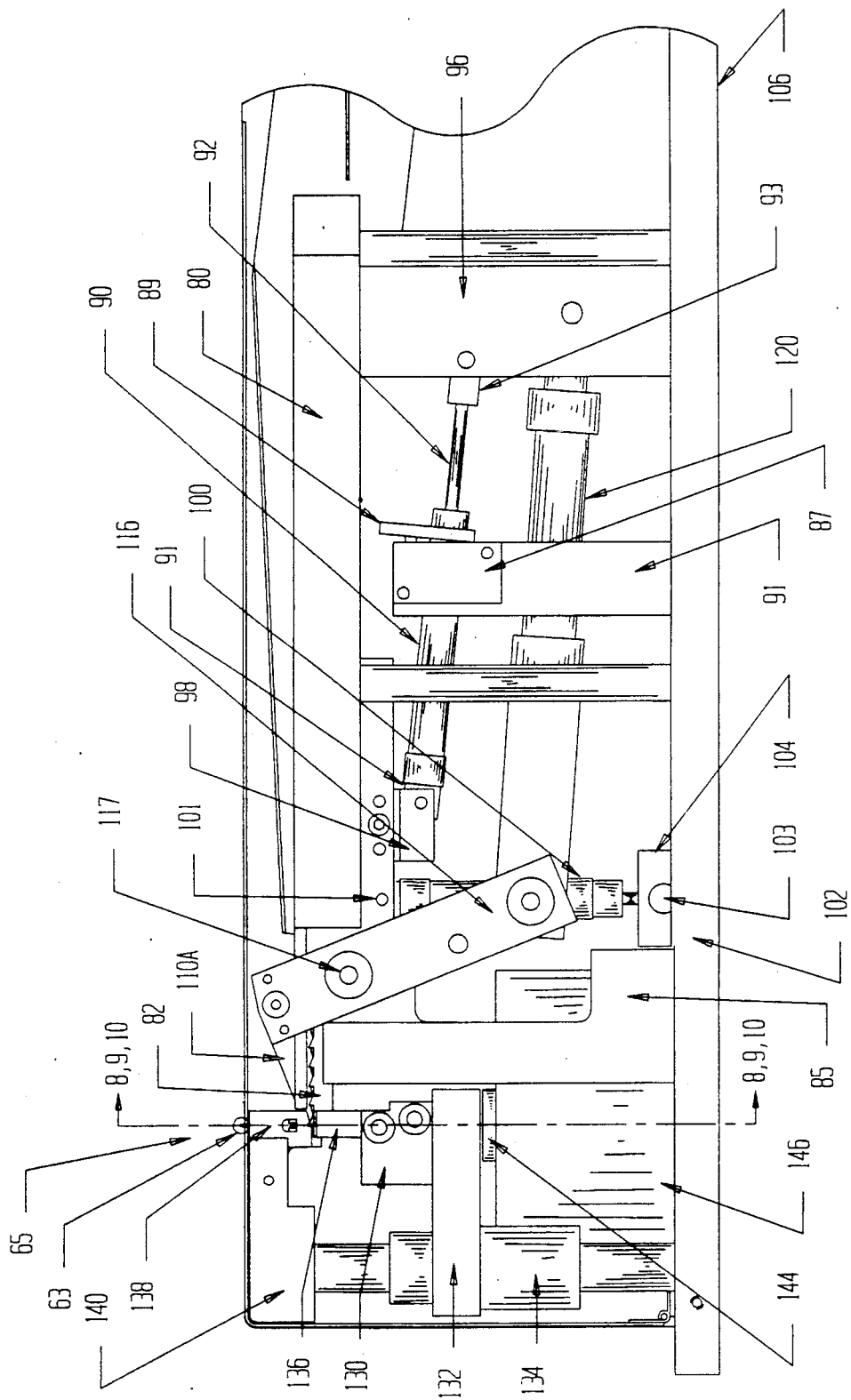
FIG. 2 is a partial side view of the apparatus of FIG. 1 with the side cover plate removed.

FIG. 2 is a partial right side view of the apparatus 50 with the side cover plate 58 removed. The bodies 63 of the respective components 62 secured to the tape 60 are supported by a body guide 80 (shown more clearly in FIG. 3) as the taped components are drawn to the cutting and forming station 65. The body guide 80 is supported at one end by bulkhead 96, and its forward end by a body guide bridge 81. The bridge 81 is in turn supported by a tie bar 85 extending upwardly from the base plate 106.

The angled teeth of a pair of lower ratchet members 82 and 84 engage the leads of the taped components; the respective lower ratchet members are disposed one on each side of the body guide 80. As shown more clearly in FIG. 3, each ratchet member 82 and 84 in turn comprises an outer and an inner ratchet element. Thus, lower ratchet 82 comprises ratchet elements 82A and 82B, and lower ratchet 84 comprises ratchet elements 84A and 84B. The respective inner and outer lower ratchet elements are separated by spacers 83 (FIG. 4), with a pin 83A extending through the spacers and lower ratchet elements to secure the elements together. A lower ratchet bracket 85 is mounted forward of the spacers 83 and secures the lower ratchet elements in an aligned relationship to comprise the lower ratchet assembly. The angled teeth of the respective ratchet elements thus engage against the leads of a particular component 62 at four separated locations, thereby tending to provide a relatively evenly distributed drive force on the leads.

The lower ratchet members 82 and 84 are driven in a reciprocating manner by a lower ratchet advance and retract cylinder 90. The cylinder 90 is a double acting pneumatic cylinder comprising a piston 92. The end 93 of the piston 92 is pivotally connected to support bulkhead 96. The opposite end 91 of the cylinder 90 is pivotally connected to the bracket 98 connected to the lower ratchet members 82 and 84. Thus, the piston 92 can be extended or retracted. The lower ratchet spacers 83 are made of a bearing material, and are urged against the bottom surface of the body guide 80 in normal operation with the bearing material permitting the lower ratchet assembly to slide against the lower surface of the body guide 80.

The lower ratchet bracket 98 is supported on an air spring, comprising the lower ratchet air spring cylinder 100. The end of piston 102 of cylinder 100 is pivotally mounted about pin 103 in support block 104, secured to the lower support plate of the feeder 50. The end of the cylinder 100 is in turn pivotally mounted to the ratchet bracket 98 about pin 101. The cylinder 100 is also a double acting pneumatic cylinder, the piston of which can be retracted or extended. In normal operation, pneumatic pressure is applied tending to extend the piston of the cylinder 100, thereby exerting an upward spring force on the lower ratchet assembly.

An upper ratchet member 110 is provided with a plurality of angled teeth which engage the taped component leads on the upper side thereof, and serve the principle functions of assisting in feeding the tape 60 forward and providing strain relief clamping on the leads of the component-in-process while the leads are cut and formed. The upper ratchet member 110 in turn comprises two respective ratchet elements 110A and 110B, one on each side of the component body. Respective spacer elements 112 and 114 are connected to the upper ratchet elements 110A and 110B, and secure these elements in an aligned, spaced relationship. The spacer elements 112 and 114 are in turn pivotally connected to respective ratchet links 116 and 118. The link 116 is pivotally mounted by pivot pin 117 to the tie bar 85. Similarly, the other link 118 is also pivotally mounted by a pivot pin (not shown) to the tie bar 85.

Figure 4:
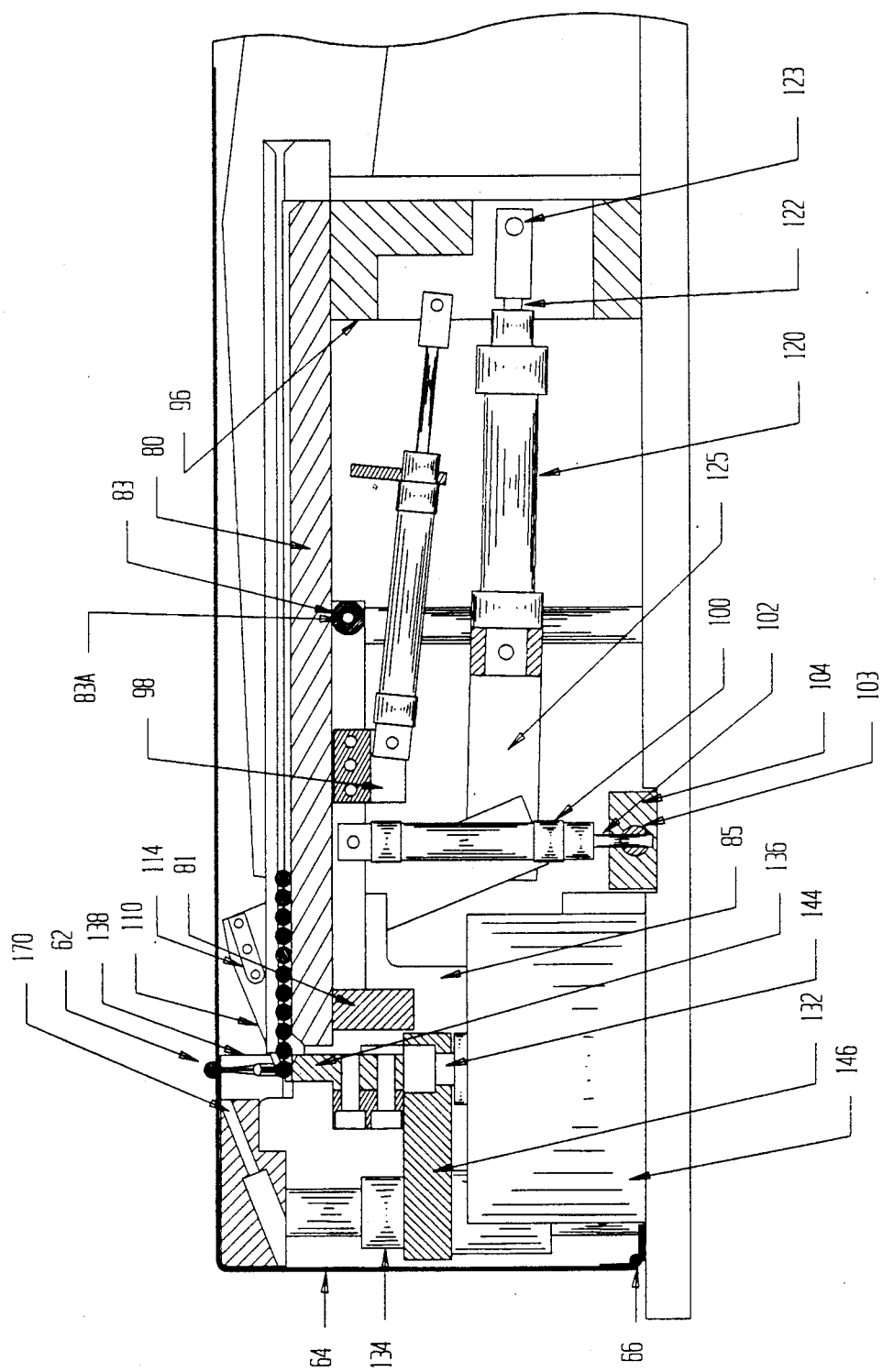
FIG. 4 is a side cross-sectional view of the apparatus of FIG. 1 taken along line 4—4 of FIG. 3.
Figure 5:
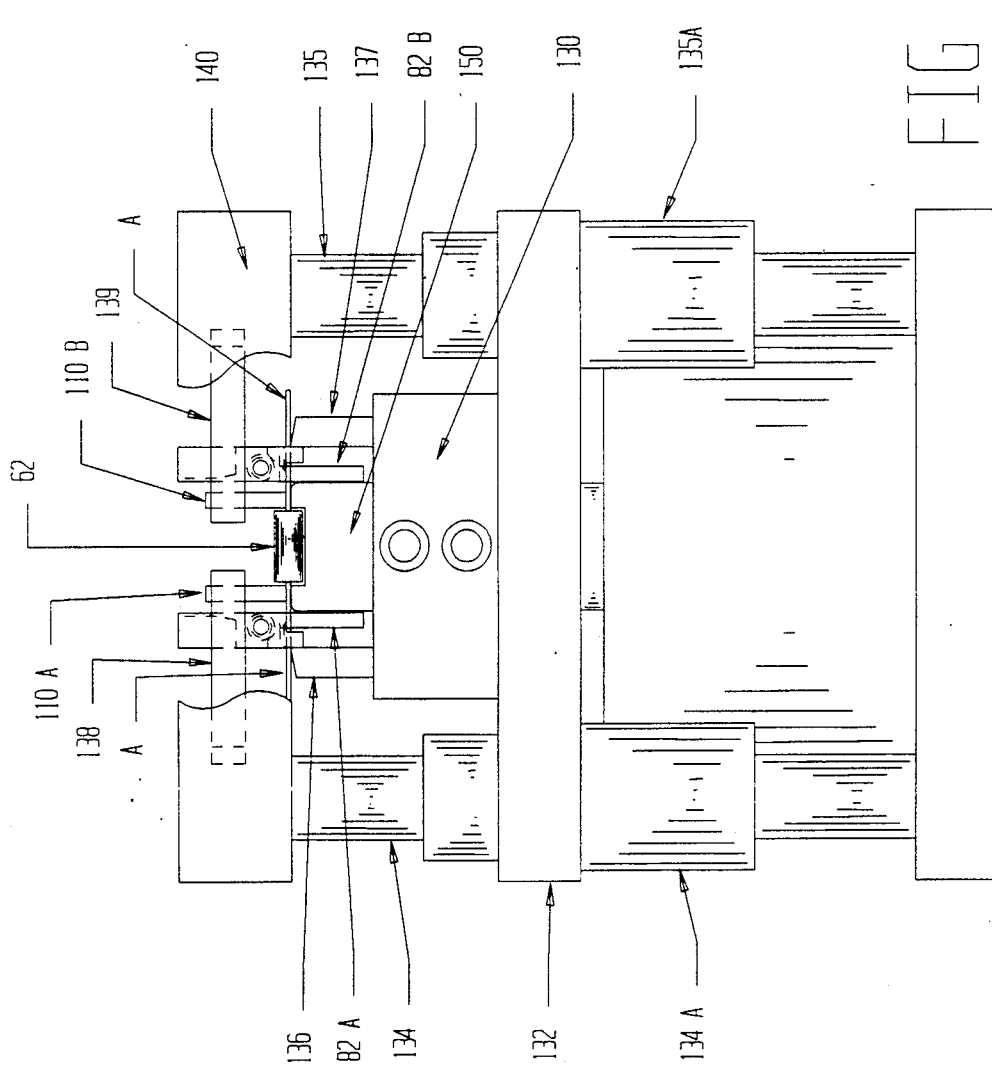
FIG. 5 is an end view of the apparatus of FIG. 1 with the end cover, plate removed, showing the upper forming die.

An upper ratchet air spring cylinder 120 is coupled to the upper ratchet assembly comprising members 110A and 110B and spacer elements 112 and 114 by the ratchet links 116 and 118. The cylinder 120 is connected to the respective ratchet links 116 and 118 by a wishbone-shaped clevis 125. The cylinder 120 is a double acting pneumatic cylinder comprising piston 122, the end of which is pivotally mounted to the bulkhead 96 by pin 123 (FIG. 4). The clevis 125 legs are pivotally connected to the respective links 116 and 118. The piston 122 can be retracted or extended; in normal operation, pneumatic pressure is applied tending to retract the cylinder piston to provide a means for exerting a downwardly extending spring force on the upper ratchet member 110. This urges the teeth surfaces against leads of the components 62.

It will be apparent that the lower ratchet members 82 and 84 provide a means for advancing the tape toward the cutting and forming station 65. The teeth of the lower ratchet members are angled so as to bite against the leads to advance the tape 60 when the piston 92 of cylinder 90 is extended. After the cylinder 90 has reached the end of its stroke, the piston 92 is retracted. This pulls the lower ratchet members 82 and 84 back toward the tape reel 55. The lower ratchet teeth are ramped in this direction and the air spring (cylinder 100) allows the lower ratchet assembly to drop down slightly as the ratchet is retracted, so that component leads are not marred. However, the teeth of the upper ratchet member 110 are angled in the opposite direction from the teeth of the lower ratchet members, and bite against the leads, preventing the tape 60 itself from being carried backward with the retracting lower ratchet members. The leads of the components 62 secured to the tape 60 slide over the ramped teeth of the lower ratchet members 82 and 84 during this phase of operation. The piston 92 can then be extended again to further advance the tape toward the cutting and forming station 65. This operation can be repeated to advance the tape at the desired rate. Of course, during a cutting and forming operation, described below, the lower ratchet members are held stationary, helping to secure the component in process at the process-start location of the station 65. The upper ratchet member provides lead strain relief clamping during the upward cut/form stroke of cylinder 146

A sensor 87 is provided to sense the full extended position of the lower ratchet. Sensor 87 is mounted to support post 91 and comprises a Hall-effect sensor which detects the close proximity of metal paddle element 89, secured on the housing of the ratchet retract and extend cylinder 90. As the cylinder piston 92 is fully extended, the sensor 87 will be tripped, sending a signal that the lower ratchet members are fully forward in position relative to the forming die at the cut and form station 65. Pneumatic pressure to the cylinder 90 is stabilized during the cut/form process.

The various pneumatic lines and valves used to operate the respective pneumatic cylinders comprising the feeder apparatus 50 have been omitted from the drawings for clarity. It will be readily apparent to those skilled in the art how to power and control these devices in the manner described. The feeder apparatus may include a pressure adjusting means to adjust the pneumatic pressure applied to cylinder 120 and thereby adjust the lead clamping force. Components with smaller diameter leads will require lower clamping force than leads with larger diameter leads.

As shown in FIG. 4, the top and end cover plate 64 is pivoted on pin 66 allowing the cover 64 to be rotated forward to gain access to the feeder for service.

Referring to FIGS. 5-10, the cutting and forming station 65 comprises several elements. A lower die holder 130 is secured to a lower die plate 132, which is in turn mounted on the end of a piston 144 comprising the cut/form cylinder 146 The cylinder 146 is a double acting pneumatic cylinder appropriately sized to drive the component-in-process through the cut/form sequences discussed below.

A lower forming die 150 is also secured to the die holder 130 between the lower cutting die 136 and 137, and provides support for the component body and leads during the cutting and forming operations. As shown more clearly in FIG. 8, the lower forming die 150 is fabricated with radiused grooves 151A and 151B in a sharp corner. The part leads are captured and stabilized in the grooves 151A and 151B, which serves to guide the part leads in the bending roller grooves (described below). This helps prevent the component-in-process 62' from moving in any direction except upwardly. A relieved area 151C is formed in the top surface of support block 150, and conforms to the shape of the component body 63. The side 150A of the block 150 facing the rear of the apparatus 50 is bevelled (see FIG.

The clamping tips of the upper ratchet elements ride over this bevelled surface at the end of the upstroke of the cylinder 146.

The lower die plate 132 is guided by upright support shafts 134 and 135. Cylindrical bearing members 134A and 135A provide a sliding fit on the support shafts 134 and 135, and are connected to the lower die plate 132. The bearing guiding of the lower die plate 132 provides stability to the lower forming and cutting dies during the cutting and forming operations. Elements 134A and 135B are brass bushings and define a support shoulder against which the lower die plate 132 rests, taking loads as cylinder 246 strokes upwardly.

The upper die blocks 138 and 139 are secured to the top plate 140. Each upper die 138 and 139 in turn comprises a bending roller defining a V-shaped roller cross-section which contacts the component lead during the upstroke of the cutting and forming cylinder 146 and bends the lead in a 90 degree (nominal) bend. (Bending rollers are also used in the axial lead component feeder of U.S. Pat No. 4,817,266 and 4,780,950). Thus, upper forming die block 138 comprises bending roller 166, and upper forming die block 139 comprises bending roller 168. The upper forming die blocks 138 and 139 remain in a stationary position throughout the forming operation; the cut/form cylinder 146 pushes the lower forming die 150 upwardly, carrying the component with it, causing the leads to contact the rollers and make the bend.

Figure 6:
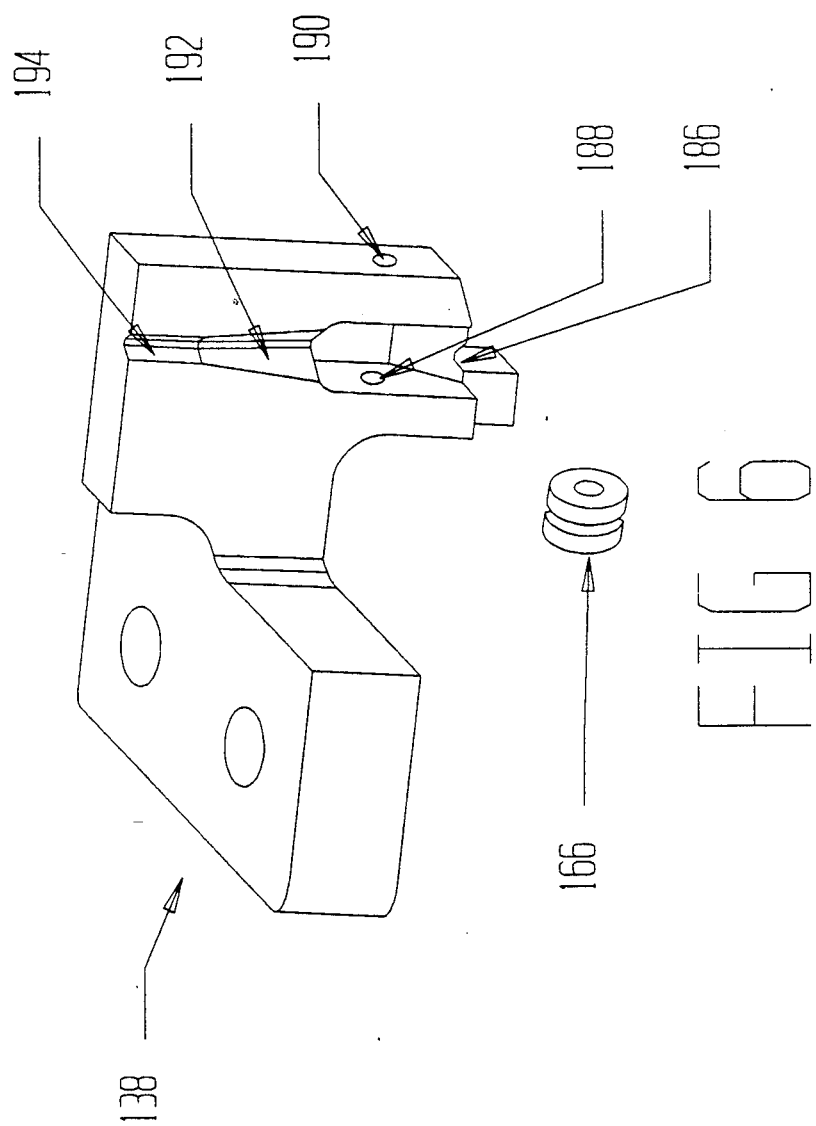
FIG. 6 is a perspective view showing one of the upper forming die in further detail.

FIG. 6 is a perspective view of the upper die block 138; the other upper die block 139 is a mirror image of block 138. Die surface 186 cooperates with the lower cutting die 136 in the lead cutting operation. The bending roller 166 is mounted on a pin (not shown in FIG. 6) fitted into bores 188 and 190. The V-shaped cross-sectional configuration of the roller 166 guides the bent lead into the partial funnel shaped grove 192, which tapers down to a narrow untapered groove portion 194. The groove portions 192 and 194 complete the bending process on the component lead.

Figure 3:
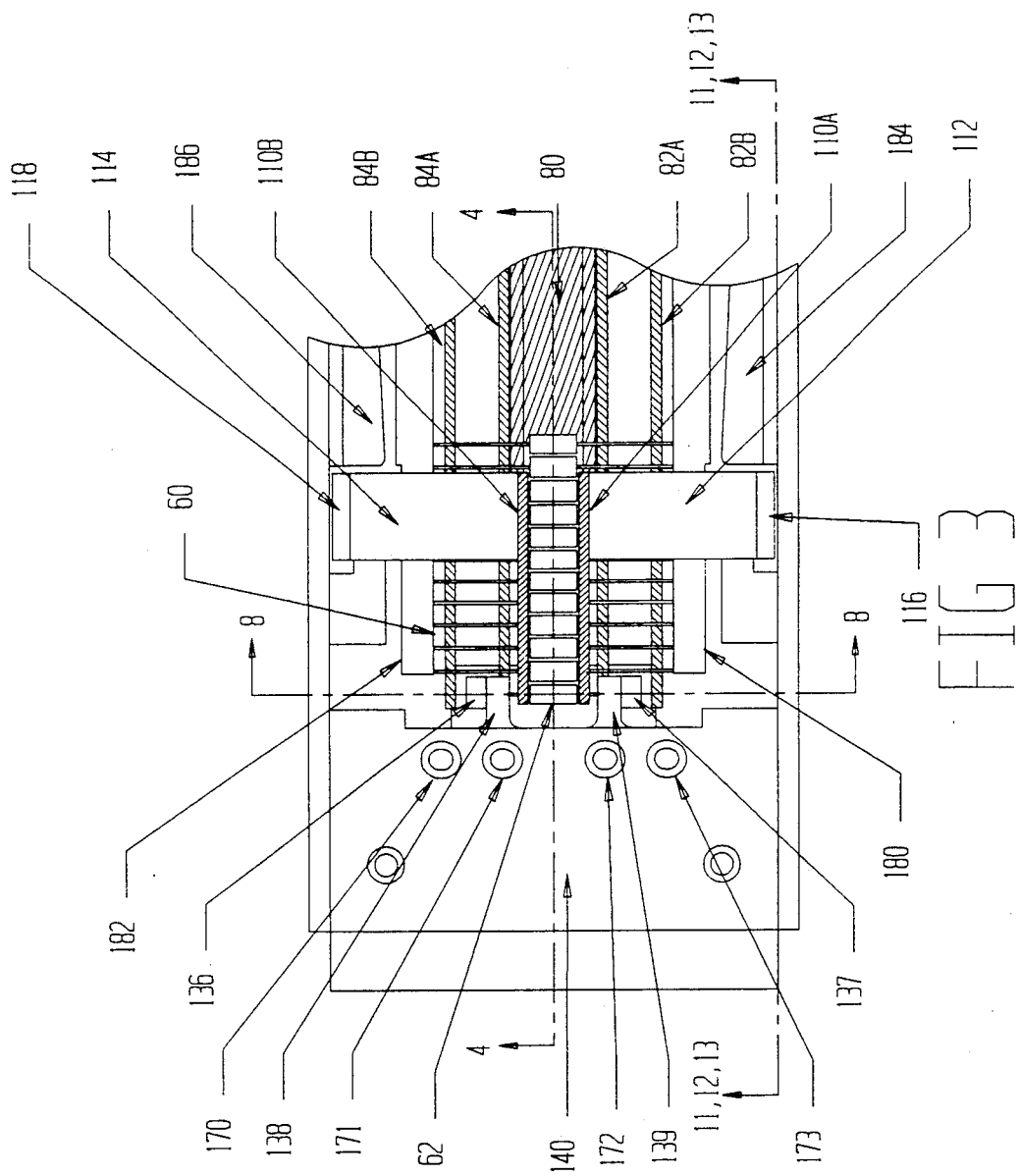
FIG. 3 is a partial top view of the apparatus of FIG. 1 taken with the top cover removed.

As shown in FIG. 3, the upper die blocks 138 and 139 are secured to the top plate 140 by threaded fasteners 170-173. This permits ready removal of the die 138 and 139 for repair or to change the apparatus 50 to accommodate a different component size. FIG. 3 also illustrates the tape guides 180 and 182, and the tape scrap chutes 184 and 186.

As shown in FIG. 4, an infrared optical sensor 170 is fitted in the top plate 140 and serves the function of sensing the presence of a component at the presentation position of the station 65. An exemplary optical sensor suitable for the purpose is the model FU-66 reflective type fiber photoelectric sensor used with an amplifier FS2-060, both marketed by Keyence Corp. of America, 20610 Manhattan Place, Torrance, Calif. 90561.

Figure 7:
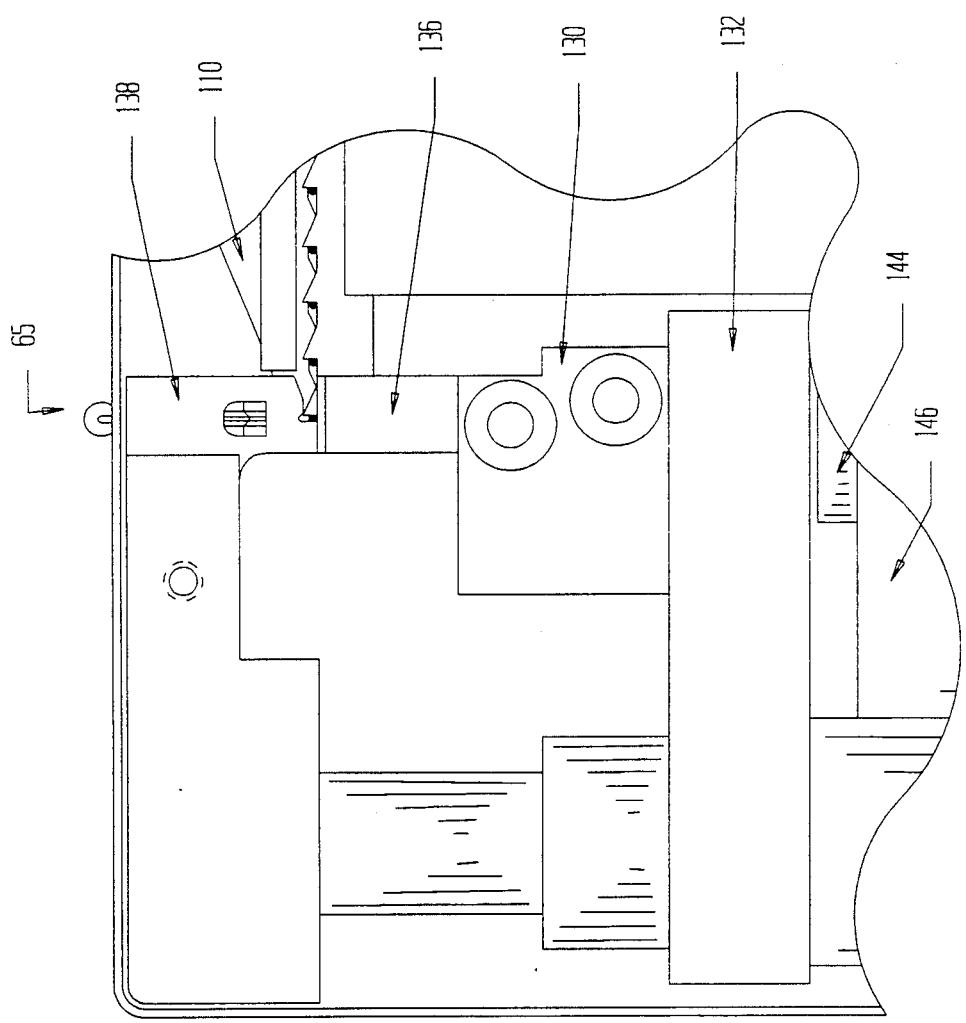
FIG. 7 is an enlargement of a portion of the side view of FIG. 2, showing the cutting and forming station.

FIG. 7 shows elements of the cutting and forming station 65 in greater detail, and in particular shows the manner in which the component leads are constrained when the component is at the process-start location at the station 65. The leads are constrained at the process-start location through the cooperation of the upper die 138, the lower die 136 and 137, the lower ratchet members 82 and 84 and the upper ratchet member 110. The complete containment of the component leads facilitates the proper cutting of the component leads without damage to the component. Strain relief end surfaces and of the upper ratchet elements 110A and 110B provide strain relief for the leads of the component-in-process during the cutting and forming process.

Figure 8:
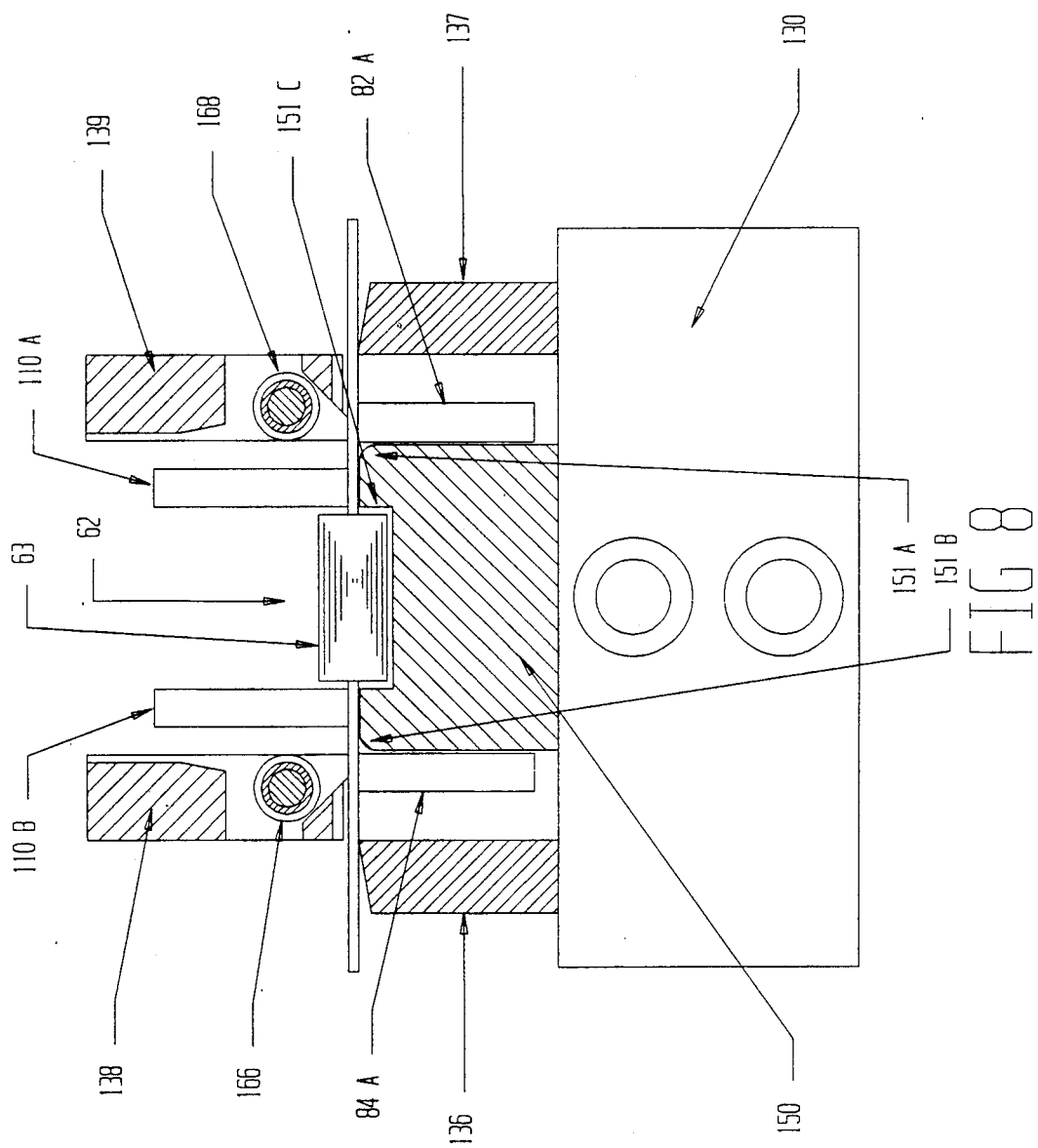
FIG. 8 is an end cross-sectional view taken along line 8—8 of FIG. 2, showing the lower cutting dies and the upper forming die with the component-in-process at the process-start location.

FIG. 8 is an end cross-sectional view of the apparatus 50. Here, a component 62' is shown in its initial process-start location before any cutting or forming operations have been performed. The lower die holder 130 provides support for the lower cutting dies 136 and 137, disposed on opposite sides of the body of the component-in-process 62'. In this view, the component-in-process 62' is shown at the process-start location with its leads constrained by the lower cutting die 136 and 137, the upper die 138 and 139, the lower ratchet members 82A and 84A, and the upper ratchet members 110A and 110B.

Figure 9:
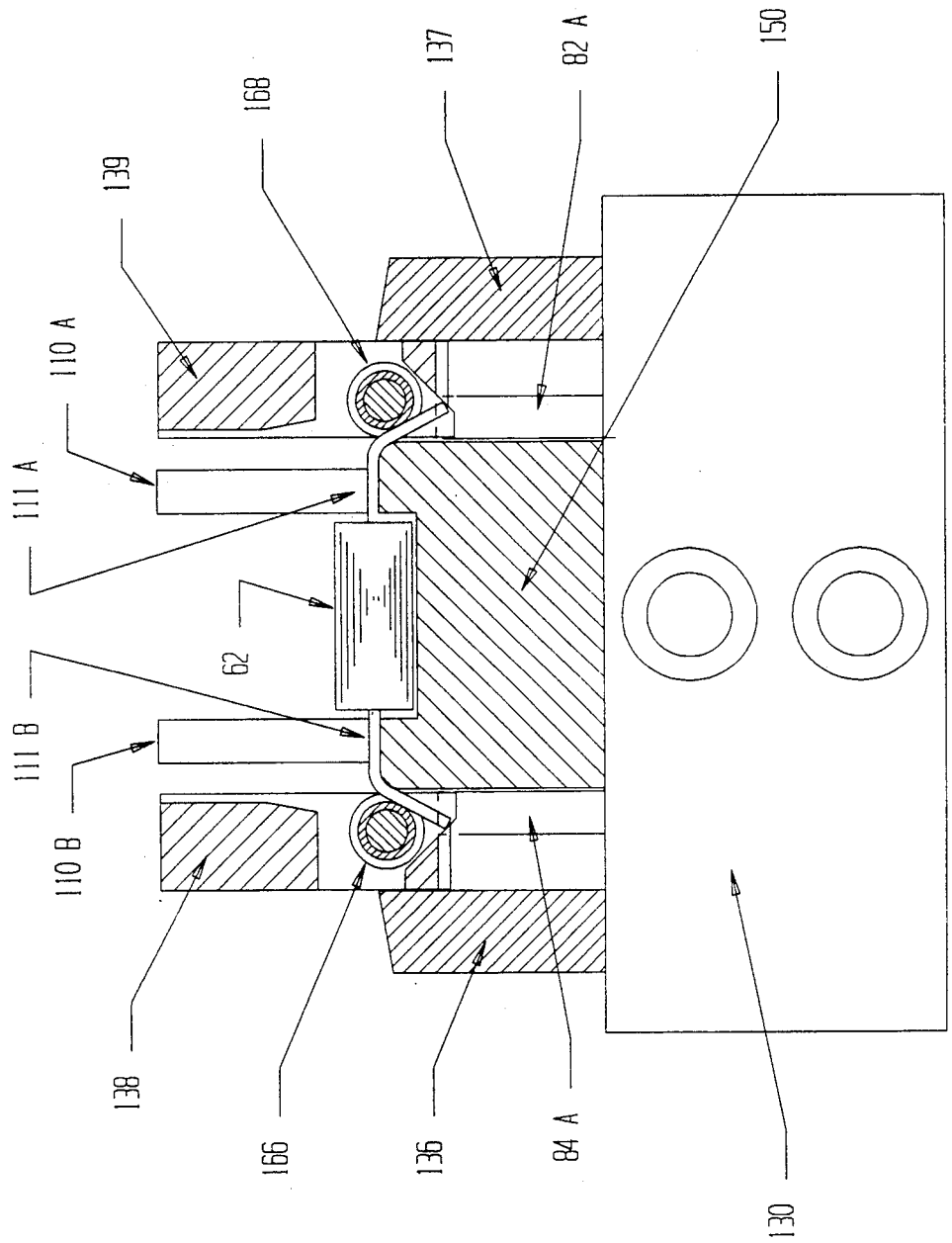
FIG. 9 is an end view similar to FIG. 8 except that the cut/form cylinder is shown in a partially upwardly stroked position to illustrate how the forming rollers contact the part leads.

FIG. 9 is similar to FIG. 8, except that the cut/form cylinder 146 is shown in a partially stroked position, so that the leads of the component-in-process 62' have already been cut, and the leads are shown contacting the bending rollers 116 and 168 during the upward stroke of the cylinder 146.

Figure 10:
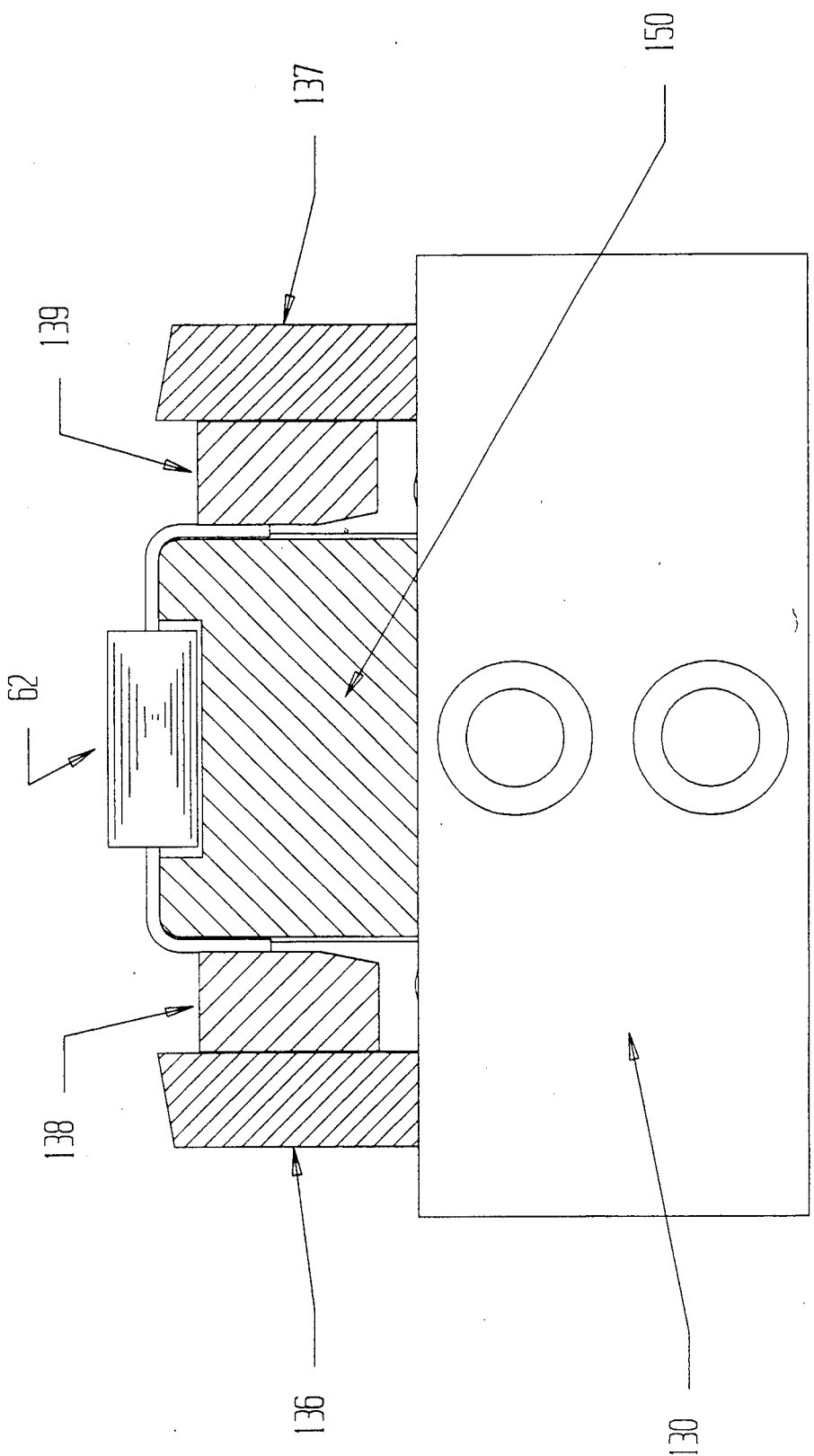
FIG. 10 is an end cross-sectional view similar to FIG. 8 except that the cut/form cylinder is shown in a fully extended position with the component-in-process leads cut and formed.

FIG. 10 is similar to FIG. 9, but now shows the component 62' at the pick-up location position at which it is left when the cylinder 146 reaches its upward limit position. At this point, the upper ratchet members have slid away and no longer clamp the leads of component 62'. The rollers 166 and 168 are hidden behind the support block 130.

Figure 11:
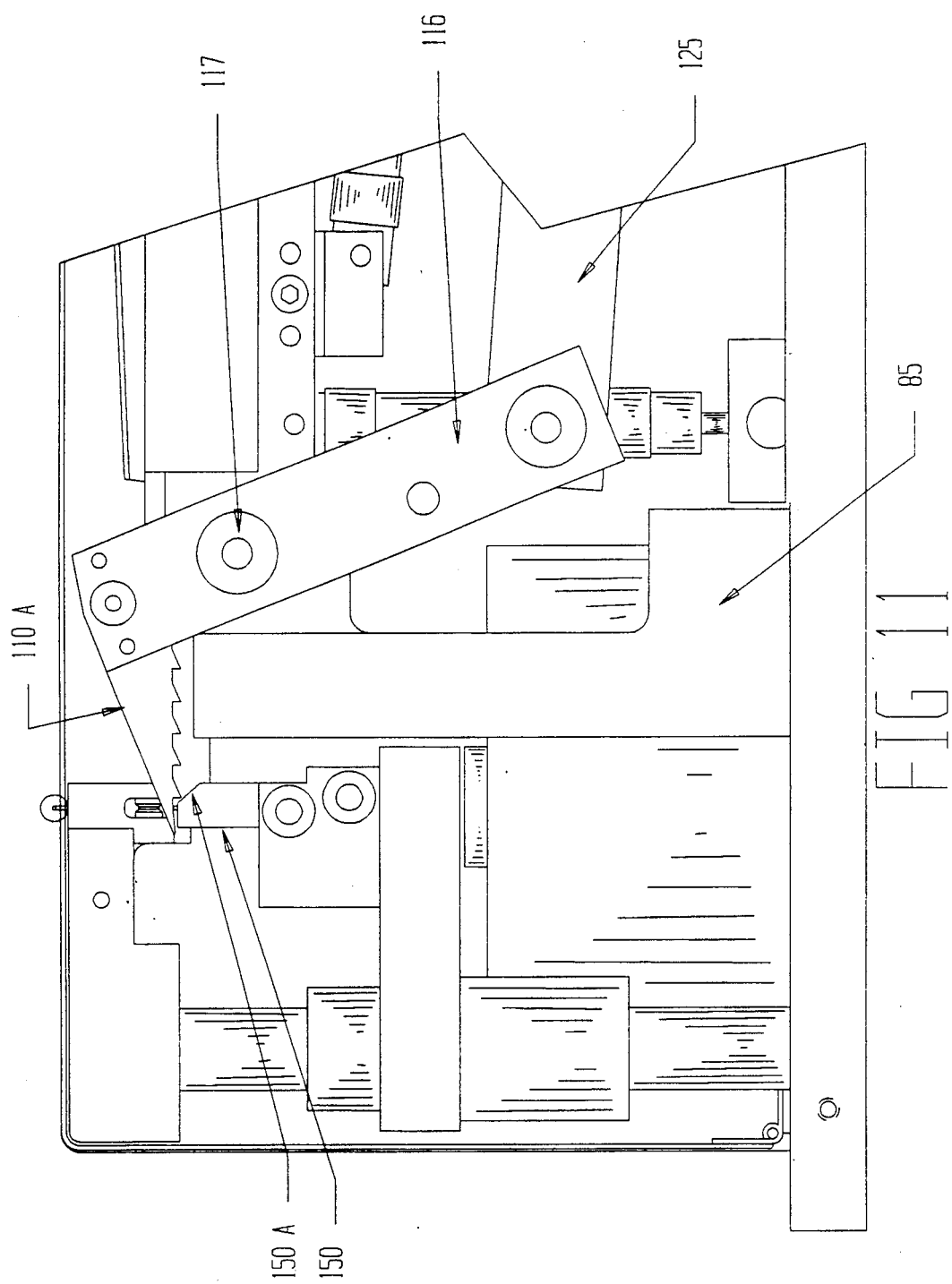
FIG. 11 is a side view of the apparatus of FIG. 1 with the side plate removed and showing the upper ratchet in the normal position clamping the leads of a component-in-process at the process-start location.
Figure 12:
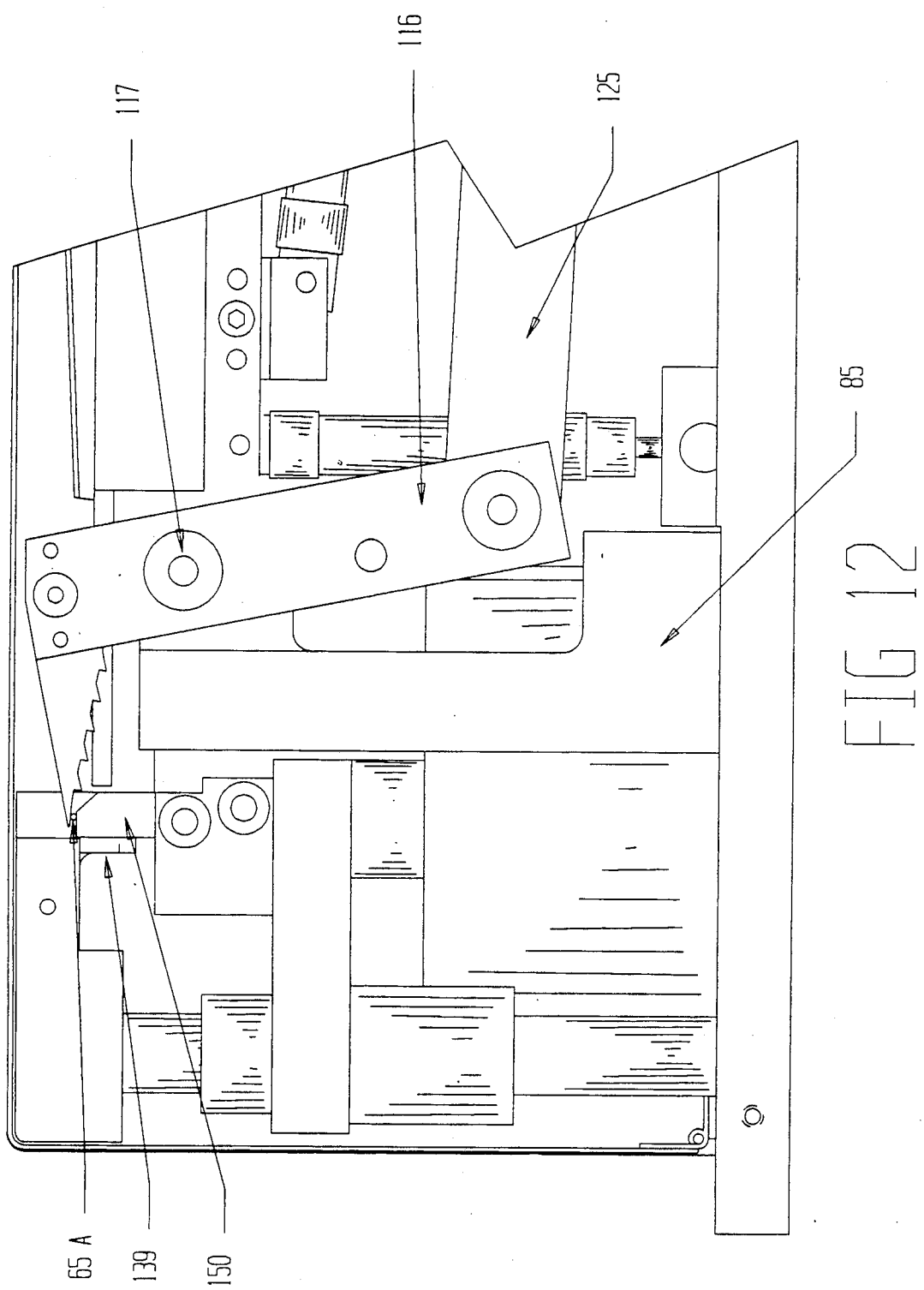
FIG. 12 is another side view of the apparatus of FIG. 1 showing the cut/form cylinder in mid-stroke position and the upper ratchet still clamping the component-in-process leads.
Figure 13:
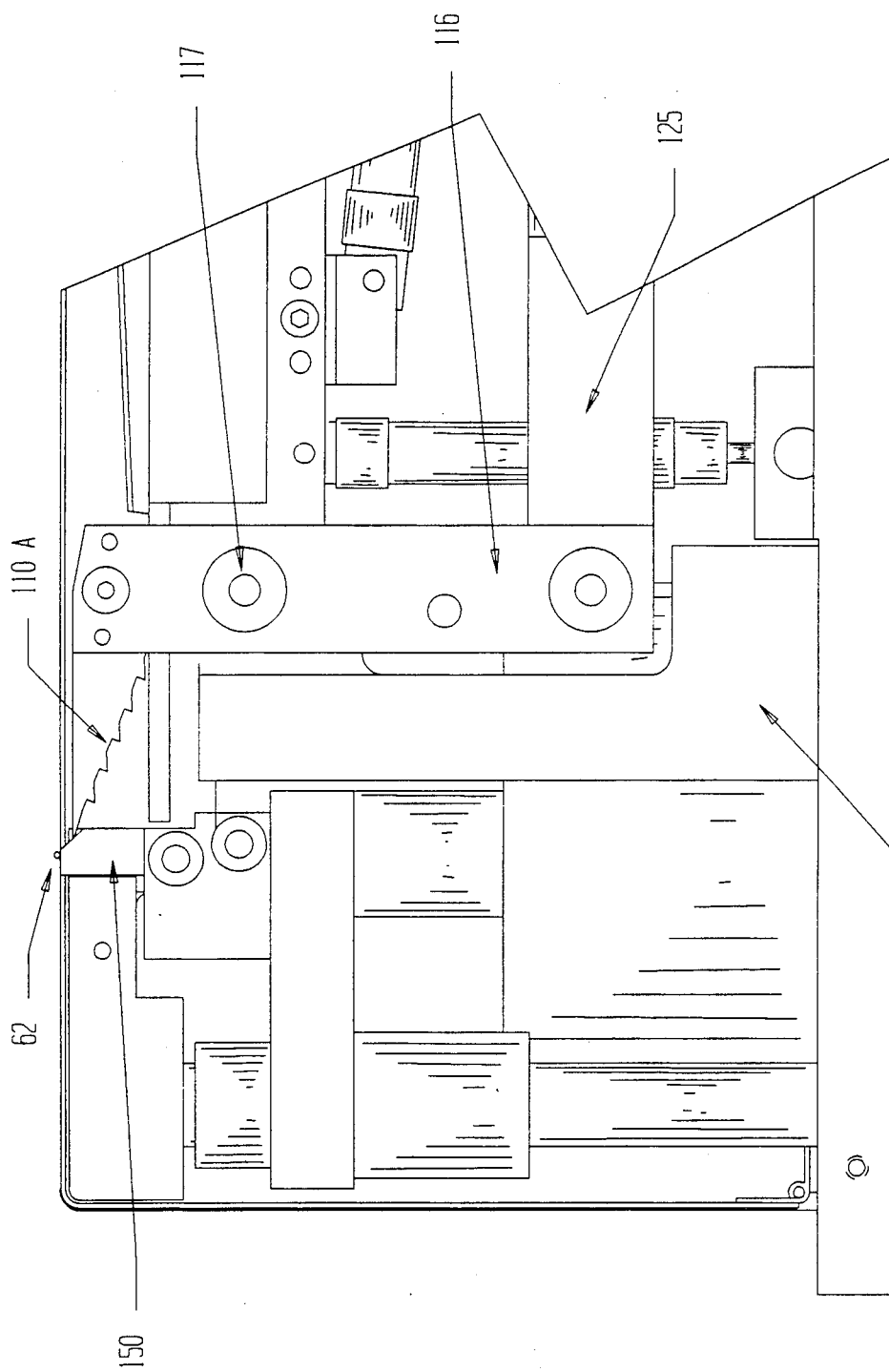
FIG. 13 is a further side view of the apparatus of FIG. 1 with the side plate removed and showing the cut/form cylinder at its fully extended position, and the upper ratchet pivoted back down and away from the finished component-in-process.

FIGS. 11-13 are side views of the apparatus 50 taken with the side cover plate removed. These views show the upper ratchet member 110 in various positions during the cut and form processing, showing in particular the strain relief clamping. In FIG. 11, the upper ratchet member is shown in position with the component-in-process in the process-start position (corresponding to the position shown in FIG. 8). In FIG. 12 the cut/form cylinder 146 is in the mid-stroke position (corresponding to the position in FIG. 9), with the upper ratchet partially pushed backward against the air spring pressure as the support die 150 is raised. In FIG. 13 the cut/form cylinder 146 is fully extended and the component-in-process is raised to the pick-up location (corresponding to the position shown in FIG. 10). Here the beveled surface 150A of the support block 150 has urged the upper ratchet 110 backward against the air spring pressure with the links 116 pivoting about pivot pin 117, so the clamping tip end of the upper ratchet 110 no longer clamps the leads of the component-in-process 62' against the support die 150. The component-in-process 62' is now available for robotic pickup at the pickup location.

Figure 14:
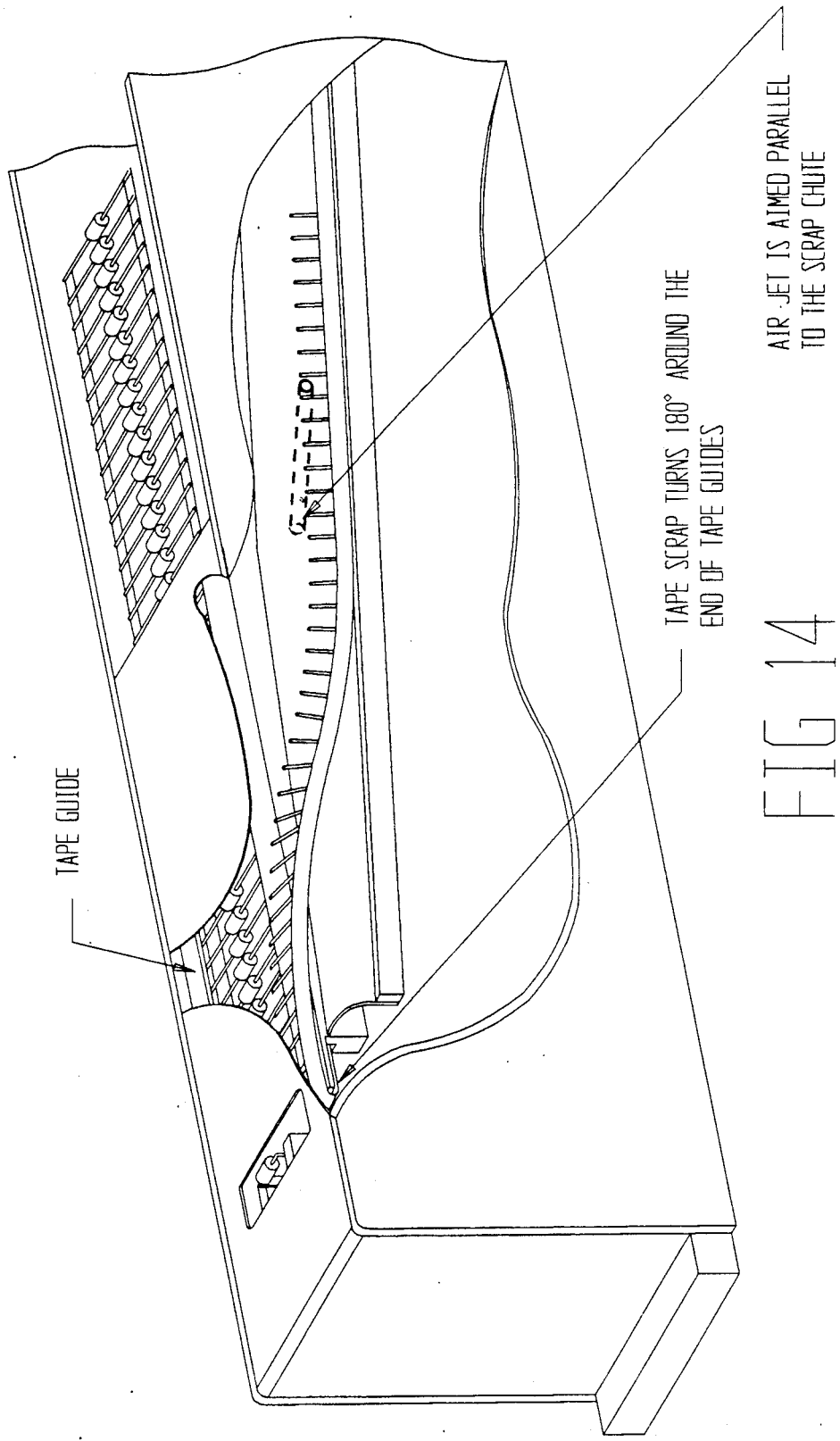
FIG. 14 is a side perspective view of the apparatus of FIG. 1 with the cover plates partially broken away to illustrate the removal of tape and lead scrap.

FIG. 14 is a partially broken-away perspective view of the apparatus 50, illustrating the manner in which the tape scrap is redirected and brought out the rear of the apparatus adjacent the tape reel. This facilitates the ready collection and removal of the scrap. The tape scraps make a 180 degree turn around the tape guides 182 and 184 (FIG. 8), and are redirected into the tape scrap chutes toward the rear of the apparatus 50. An air jet 190 on each side of the feeder serve to direct blasts of pressurized air at the scrap, and are aimed parallel to the scrap chutes 184 and 186. This provides a force tending to move the scrap toward the rear of the apparatus, as the tape is fed forward into the cut and form station 65.

The overall operation of the feeder apparatus is as follows. The pneumatic cylinder 90 is actuated to extend the piston 92, thereby moving the lower ratchet member toward the station 65, whereby the axial leads of the component-in-process are clamped against the surface 187 of the upper forming die by the end teeth of the inner lower ratchet elements. The upper ratchet members clamp the leads against the lower forming die 150. The leads are totally contained at the process-start location, so that the component leads can move only upwardly. The cut/form cylinder 146 is now actuated to extend piston 144, raising the lower support die and lower cutting die from the process-start position to the component pickup location. As the support die 150 and lower cutting die are raised, the leads are captured between the lower cutting die and surfaces of the upper forming die, cutting the leads to a predetermined length. The tape and lead scraps are led away to the scrap chutes. As the support block 150 continues upwardly, the leads are still strain relief clamped against the support die 150 by the upper ratchet member, and engage the bending rollers 166 and 168, and are bent as the support die continues its upward translation. The leads are held in corresponding grooves of the upper forming die by lead springback. With the component-in-process now at the pickup location, it is now ready for robotic pickup. After the part is picked up, the piston 144 is retracted, moving the support die and lower cutting die downwardly to be ready for the next component to be ratcheted in place by the lower ratchet members. Operation can then be repeated for the next component-in-process.

One feature of the feeder apparatus 50 is the provision of a control which actuates the pneumatic cylinders 100 and 120 to permit the tape 60 to be loaded into, or unloaded from the feeder. This control causes cylinder 120 to be fully extended, raising the upper ratchet member 110 well above the tape body guide so that the teeth of the upper ratchet will not engage taped component leads supported on the body guide 80. The control also causes the cylinder 100 to be fully retracted, lowering the ratchet assembly well below the body guide so that the teeth of the lower ratchet will not engaged the leads of taped components supported on the body guide 80. With the upper and lower ratchets in such positions, the tape 60 can easily be fed into, or removed from, the apparatus 50. The control can take the form of a switch mounted n the apparatus for generating signals to valves controlling the application of pneumatic pressure to the cylinder 100 and 120 to cause pressure to be applied to retract the piston of cylinder 100 and to extend the piston of cylinder 120. An axial lead component feeder apparatus has been described which has several important advantages, including:

1. The feeder has a relatively few number of change parts, which allows the feeder to be reconfigured to feed a different component relatively quickly and inexpensively. In the exemplary embodiment described, the only change tooling parts are the lower die holder 130, the lower cutting die 136 and 137, the upper forming die 138 and 139, the component body guide 80, and upper and lower ratchet spacers, defining the distance between ratchet elements.

2. The feeder is characterized by simpler mechanics than other axial lead feeders, leading to higher reliability and lower cost.

3. The feeder has a narrow footprint and low profile, permitting more feeders to be fitted into a given area, and to work within a limited Z axis profile.

4. Processed part pickup is at the cut/form station; no separate conveyor system is required to transport processed parts from the cut/form station to a robotic pickup station.

5. The feeder has a relatively higher part refresh rate than prior feeders, permitting the feeder to supply more processed parts in a given time, resulting from the fact the parts do not have to travel from the cut/form station to a separate robotic pickup station.

6. Improved scrap removal allows the tape scraps to be brought out at the rear of the feeder.

7. The upper ratchet performs the functions of assisting in feeding the tape forward and providing strain relief on part leads in process, and also prevents the tape from feeding backwards during normal feeder operation.

8. The feeder is provided with cover plates which may be removed without affecting the functioning of the feeder, thereby facilitating trouble-shooting and de-bugging.

9. Positive containment of the component-in-process leads, in that the leads are constrained by the lower cutting die, lower and upper ratchet member teeth and the upper forming die at the process-start location to prevent any movement of the leads which could result in part jamming. Positive containment assures the leads will properly engage the forming rollers.

10. No feeder structure extends above the processed part at its robotic pickup point, thereby minimizing the danger of the pickup robot crashing against the feeder structure during the part pickup process.

11. There is no way to crash the cutting and forming parts of the feeder if the operational sequence is altered, e.g., during or as a result of trouble shooting.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. A component lead cutting and forming apparatus for axial lead electronic components respectively having first and second leads secured to tape, comprising:
   a lead cutting and forming station, wherein successive components secured to the tape are processed to cut and form the leads and presented at a station pickup location for robotic pickup;
   means for driving the tape so as to present successive components secured to the tape to a process-start location comprising said station; and
   wherein said station is further characterized in that the lead forming and cutting operations are performed as the component-in-process is moved from said process-start location to said pickup location within said station, and comprises:
   (i) upper forming die disposed above said process-start location, and having lead forming elements and lead cutting surfaces;
   (ii) lower support means for supporting said component-in-process body and leads during the lead cutting and forming operations;
   (iii) lower component lead cutting die members for acting in cooperation with said lead cutting surfaces of said upper forming die to cut the component-in-process leads to a desired length during the component lead cutting and forming operations;
   (iv) means for translating said lower support means and said lower cutting members to carry said component-in-process from said process-start position to said pickup position, said component-in-process leads being cut and formed during said translation, wherein said component leads are cut and formed, and the component-in-process is moved from said process-start position to said pickup position in a single movement; and
   (iv) means for providing strain relief clamping of the leads of said component-in-process against said lower support means during said cutting and forming operation.

2. The apparatus of claim 1 further characterized by means for fully constraining the leads of a component-in-process at the process-start location of said station, thereby securing the component-in-process at the commencement of the cut and form process.

3. The apparatus of claim 2 wherein said constraining means comprises surfaces of said upper forming die and said lower support means.

4. The apparatus of claim 3 wherein said tape driving means comprises a lower ratchet member having a plurality of spaced angled teeth for engaging the leads of components secured to said tape, means for driving said lower ratchet member so as to drive said tape toward said cutting and forming station, and an upper ratchet member having a plurality of teeth angled in a direction opposite the teeth of the lower ratchet member, and wherein said lower ratchet member comprises an end surface which contacts the underside of the leads of said component-in-process at said process-start location, and said upper ratchet member comprises a clamping surface which clamps the upper side of the leads of the component-in-process at the process-start location.

5. The apparatus of claim 4 wherein said upper ratchet member is biased by a spring force to clamp said clamping surface toward said lower support means.

6. The apparatus of claim 5 wherein said upper ratchet member provides strain relief clamping of said component-in-process leads by said clamping surface against said lower support means as said leads are cut and formed at said station.

7. The apparatus of claim 6 further comprising means for selectively moving the lower and upper ratchet members away from said tape to permit the apparatus to be loaded or unloaded with tape.

8. The apparatus of claim 1 wherein said translating means comprises a pneumatic cylinder comprising an extensible piston member which exerts a force to drive said lower support means and said lower cutting die upwardly to perform said cutting and forming operations.

9. The apparatus of claim 1 wherein said tape drive means comprises a lower ratchet member arranged with a plurality of angled ratchet teeth appropriately spaced to engage against the taped leads of components, and means for driving the lower ratchet in a reciprocating movement.

10. The apparatus of claim 9 wherein said lower ratchet member comprises, for each component lead, inner and outer ratchet elements, one disposed adjacent the respective component bodies, the other disposed outward of the component bodies.

11. The apparatus of claim 9 wherein said lower ratchet driving means comprises a pneumatic cylinder.

12. The apparatus of claim 1 further characterized in that said apparatus is characterized by a relatively low Z axis profile, in that the apparatus does not have structure extending in the Z axis above the component pickup location in the vicinity of the station, thereby minimizing the risk that a pickup robot will inadvertently strike the apparatus structure in the course of component pickup movements.

13. The apparatus of claim 1 further comprising means for guiding the tape and lead scraps resulting from the cutting operation away from the lead cutting and forming station.

14. The apparatus of claim 13 wherein said guiding means comprises a tape scrap chute into which the tape and lead scraps are directed and which extends toward the rear of the apparatus away from the cutting and forming station, and air jet means for directing a stream of air along the scrap chute toward the rear of the apparatus, thereby tending to move the scrap toward the rear as the tape is driven toward the cutting and forming station.

15. The apparatus of claim 1 wherein said lower support means comprises a lower support die comprising a corner radiused groove to receive a portion of the component-in-process lead, serving to constrain the component-in-process from moving except in a direction upwardly during the forming and cutting operation.

16. The apparatus of claim 1 further comprising first and second side cover plates for covering the apparatus sides during normal operation, but which may be removed for apparatus servicing without preventing the functioning of said apparatus to cut and form leads.

17. The apparatus of claim 1 wherein said lead forming surfaces of said upper forming die comprises, for each component body lead, a bending roller mounted so as to engage and bend the lead during the translation from the process-start location to the pickup location and thereafter guide the formed lead into a tapered groove comprising the upper forming die.

18. The apparatus of claim 1 wherein said means for providing strain relief clamping comprises:
an upper clamping member mounted for pivotal movement about a pivot point, said member having a lead clamping surface which engages against said component lead when the component is at the process-start location;
means for biasing said upper clamping member tending to urge said lead clamping surface against said leads; and
wherein the size of said upper clamping member and the position of said pivot point is selected so that, as said component-in-process is translated from said process-start location to said pickup location, said clamping surface engages against the lead to provide strain relief clamping against said lower support means during said lead cutting and forming operations, but when the component-in-process reaches the pickup location, said clamping surface no longer engages the component lead and is disposed away from said component-in-process so as not to interfere with the component pickup.

19. The apparatus of claim 18 wherein said lower support means comprises a bevelled surface, and wherein, as said lower support means is translated to carry said component-in-process from said process-start location to said pickup location, said lead clamping surface of said upper clamping member slides from engagement against said component lead to said bevelled surface, wherein said clamping surface is below the body of the component-in-process when disposed at said pickup location.

20. A component lead cutting and forming apparatus for axial lead electronic components respectively having first and second leads secured to tape, comprising:
a lead cutting and forming station, wherein successive components secured to the tape are processed to cut and form the leads and presented at a station pickup location for robotic pickup;
means for driving the tape so as to present successive components secured to the tape to a process-start location comprising said station, said means comprising upper and lower ratchet members having angled teeth, the teeth of the lower ratchet angled to engage against leads of components to drive the components toward said process-start location, the teeth of the upper ratchet being angled in a sense opposite the lower ratchet teeth; and wherein said station further comprises:
- (i) upper forming die disposed above said process-start location, and having lead forming elements and lead cutting surfaces;
- (ii) lower support means for supporting said component-in-process body and leads during the lead cutting and forming operations;
- (iii) component lead cutting die members for cutting the component-in-process leads to a desired length during the component lead cutting and forming operations;
- (iv) means for translating said lower support means and said lower cutting members to carry said component-in-process from said process-start position to said pickup position, wherein said component leads are cut and formed, and the component-in-process is moved from said process-start position to said pickup position in a single movement; and
- (iv) means for providing strain relief clamping of the leads of said component-in-process against said lower support means during said cutting and forming operation, said means comprising clamping surfaces of said upper ratchet member, said strain relief clamping means further characterized in that said clamping surfaces no longer engage said leads of said component-in-process when disposed at said pickup location and are disposed away from said component-in-process so as not to interfere with its pickup.

21. The apparatus of claim 20 further characterized by means for fully constraining the leads of a component-in-process at the process-start location of said station, thereby securing the leads of the component-in-process at the commencement of the cut and form process.

22. The apparatus of claim 21 wherein said constraining means comprises surfaces of said upper forming die and said lower support means, said lower ratchet member and said clamping surfaces of said upper ratchet member.

23. The apparatus of claim 20 wherein said upper ratchet member is mounted for pivotal movement about a pivot point, and said strain relief clamping means is further characterized by:
- means for biasing said upper ratchet member, tending to urge said lead clamping surface against said leads; and
- wherein the size of said upper ratchet member and the position of said pivot point is selected so that, as said component-in-process is translated from said process-start location to said pickup location, said clamping surface engages the leads to provide strain relief clamping against said lower support means during said lead cutting and forming operations, but when the component-in-process reaches the pickup location, said clamping surface no longer engages the component lead and is disposed away from said component-in-process so as not to interfere with the component pickup.

24. The apparatus of claim 23 wherein said lower support means comprises a bevelled surface, and wherein, as said lower support means is translated to carry said component-in-process from said process-start location to said pickup location, said lead clamping surface of said upper ratchet member slides from engagement against said component lead to said bevelled surface, wherein said clamping surface is below the body of the component-in-process when disposed at said pickup location.

* * * * *